(12) United States Patent
Waldrop et al.

(10) Patent No.: US 11,495,281 B2
(45) Date of Patent: Nov. 8, 2022

(54) WRITE INTERAMBLE COUNTER

(71) Applicant: Micron Technology, Inc., Boise, ID (US)

(72) Inventors: William C. Waldrop, Allen, TX (US); Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 206 days.

(21) Appl. No.: 16/834,409

(22) Filed: Mar. 30, 2020

(65) Prior Publication Data
US 2021/0304809 A1    Sep. 30, 2021

(51) Int. Cl.
| | | |
|---|---|---|
| *G11C 11/00* | (2006.01) | |
| *G11C 11/4076* | (2006.01) | |
| *G06F 11/10* | (2006.01) | |
| *G11C 11/4096* | (2006.01) | |
| *G11C 11/4093* | (2006.01) | |

(52) U.S. Cl.
CPC ...... *G11C 11/4076* (2013.01); *G06F 11/1004* (2013.01); *G11C 11/4093* (2013.01); *G11C 11/4096* (2013.01)

(58) Field of Classification Search
None
See application file for complete search history.

(56) References Cited

U.S. PATENT DOCUMENTS

| | | | | |
|---|---|---|---|---|
| 7,911,857 | B1 * | 3/2011 | Venkataraman | G06F 13/1689 |
| | | | | 365/189.15 |
| 8,526,249 | B1 * | 9/2013 | Swanson | G11C 7/222 |
| | | | | 365/193 |
| 10,198,200 | B1 * | 2/2019 | DeSimone | G06F 3/0673 |
| 2008/0005518 | A1 * | 1/2008 | Gillingham | G11C 7/1066 |
| | | | | 711/167 |
| 2010/0220536 | A1 * | 9/2010 | Coteus | G11C 7/106 |
| | | | | 365/193 |
| 2010/0293406 | A1 * | 11/2010 | Welker | G06F 13/1689 |
| | | | | 713/401 |
| 2019/0259433 | A1 | 8/2019 | Penney et al. | |
| 2019/0379564 | A1 * | 12/2019 | Giovannini | G06F 3/05 |

OTHER PUBLICATIONS

A. Alexandropoulos, F. Plessas and M. Birbas, "A dynamic DFI-compatible strobe qualification system for Double Data Rate (DDR) physical interfaces," 2010 17th IEEE International Conference on Electronics, Circuits and Systems, 2010, pp. 277-280, doi: 10.1109/ICECS.2010.5724507. (Year: 2010).*
Huber, Dr. William R.; "Memories in Computers—Part 2: DDR-SDRAMS"; 2018; pp. 1-43.

* cited by examiner

*Primary Examiner* — Daniel F. McMahon
(74) *Attorney, Agent, or Firm* — Fletcher Yoder, P.C.

(57) ABSTRACT

Systems and methods are provided that provide protection from undesired latching that may be caused by indeterminate interamble periods in an input/output data strobe (DQS) signal. Interamble compensation circuitry selectively filters out interamble states of the DQS signal to reduce provision of interamble signals to downstream components that use the DQS signal to identify data latching times.

20 Claims, 9 Drawing Sheets

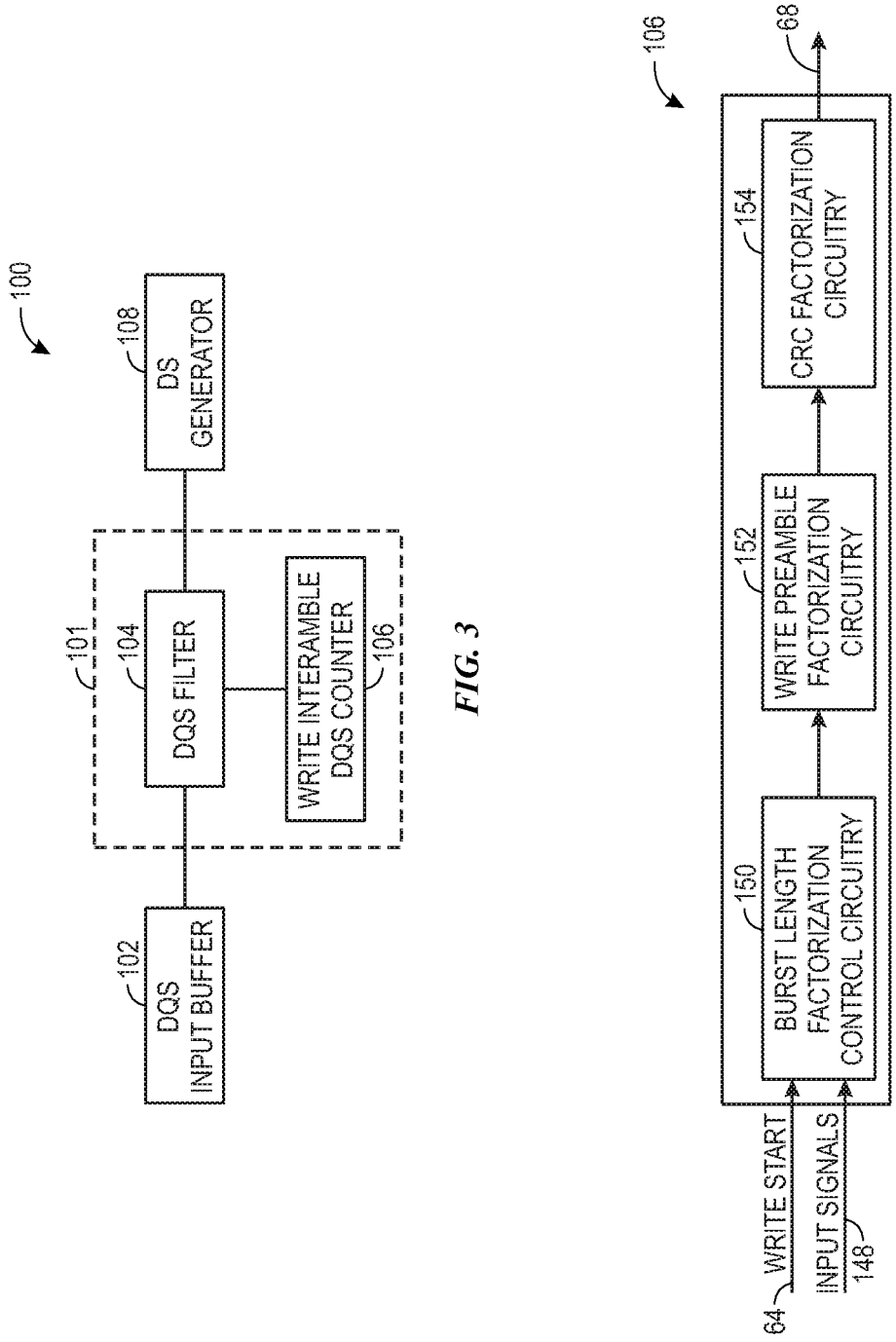

A WRITE BL16 TO WRITE BL16 NON-GAPLESS SEQUENCE IS SHOWN

WRITE INTERAMBLE COUNTER

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

In recent years, memory devices have become increasing complex. As the complexity of these memory devices increase, a likelihood for data errors occurring may increase. For example, when a read operation occurs, the operation is driven from the memory device to the CPU. When a write operation occurs, the operation is driven from the CPU to the memory device. When neither operation is driven, clock signals used to time these commands (e.g., data strobe (DQS) and DQS Bar (DQSF) signals) may be indeterminate (e.g., at or near the same voltage). In such indeterminate states, unpredictable interambles may be introduced in clock signals (DQS and DQSF signals), which may cause errors (e.g., premature and/or delayed latching) in downstream components. For example, depending on the system, downstream components may treat these indeterminate states differently, where some may bias in one direction or another (e.g., some towards a DQS high and others to a DQS low). Mis-clocking data latches by even one clocking cycle to or from the memory device may cause a data error. Thus, mechanisms for removing these interambles may be desired.

BRIEF DESCRIPTION OF THE DRAWINGS

Various aspects of this disclosure may better be understood upon reading the following detailed description and upon reference to the drawings in which:

FIG. 3 is a schematic diagram of an embodiment of the interamble compensation circuitry of FIG. 2, according to an embodiment of the present disclosure;

FIG. 4 is a schematic diagram of an embodiment of the interamble counter circuitry of FIG. 3, according to an embodiment of the present disclosure.

DETAILED DESCRIPTION

Figure 1:
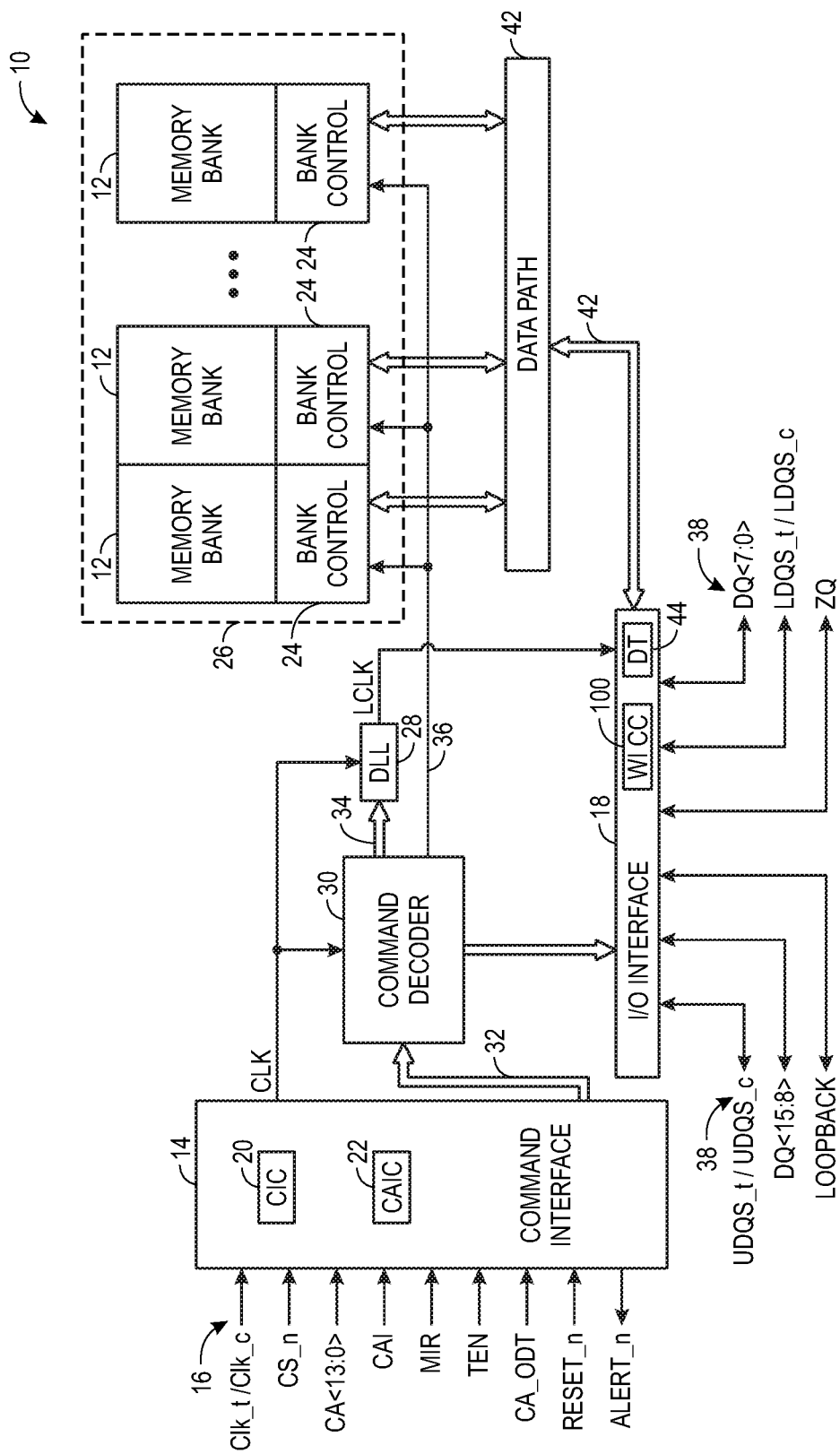
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers'specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Embodiments of the present disclosure relate generally to the field of semiconductor memory devices. More specifically, embodiments of the present disclosure relate to an interamble compensation circuit of a semiconductor memory device to remove possible indeterminant signals from input/output signals (DQS signals) used to latch write commands in a memory device. For example, indeterminate states of DQS and DQS Bar (DQSF) between write commands where voltages of a DQS signal and a DQSF signal may result in interambles in the DQS signals of a memory device, which, when present, may cause pre-mature or lagging latching of data. For example, some downstream logic may bias DQS high during these interambles and other components may bias the DQS low during these interambles. One manner to compensate for these interambles in the DQS signals is to use a compensation circuit (e.g., a timed filter) that actively filters out these interambles from the DQS and DQSF signals (e.g., based upon determined write command start and end times). This is described in detail below.

Using interamble compensation circuitry of a memory device to perform interamble filtering, such as to reduce interamble signals being sent to downstream components of a memory system, may be valuable. Indeed, interambles in the DOS and DQSF signals may result in indeterminate states that may cause unpredictable results for a memory device (e.g., pre-mature and/or delayed latching). For example, there may be a duration of time that the memory device is not receiving a DQS signal (e.g., steady state or disabled state), and thus is in an idle period. During this idle period, the DQS and DQSF signals may be in an unpredictable/indeterminate state (e.g., DQS and DQSF may have converging voltages). Depending on the components that receive these signals, different actions may occur. For example, some components may bias the indeterminate signals towards high, which may result in an unintended latching by the memory device.

To reduce these unintended actions, which can lead to corruption of the memory device, an interamble compensation circuit may be used to filter out interambles from reaching downstream components. Once enabled, the compensation circuit may implement filtering of the DQS and/or DQSF signals, for a particular number of clock cycles, such that these signals do not reach downstream components. As may be appreciated, the clock cycles where the filter is activated may be clock cycles when an indeterminate state is present, thereby ensuring that interamble signals are not provided to downstream components. This may help to ensure proper functioning of the memory device without undesirable side effects occurring due to the interambles.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual in-line memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 that receives signals 16 from an external device (not shown), such as a processor or controller, and provides the signals 16 to other portions of the memory device 10. The memory device 10 may also include an input/output (I/O) interface 18 configured to exchange (e.g., receive and transmit) signals with external devices. The external device (e.g., a processor or controller) may provide various signals 16 to the memory device 10, via the command interface 14, to facilitate the transmission and receipt of data to be written to or read from the memory device 10.

As will be appreciated, the command interface 14 may include a number of circuits, such as a clock input circuit 20 and a command address input circuit 22, for instance, to ensure proper handling of the signals 16. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, refresh commands) are typically entered on the positive edges of the clock signal and data is transmitted or received on both the positive and negative clock edges.

In some cases, each memory bank 12 includes a bank control block 24 which provides the necessary decoding (e.g., row decoder and column decoder), as well as other features, such as timing control and data control, to facilitate the execution of commands to and from the memory banks 12. Collectively, the memory banks 12 and/or the bank control blocks 24 may be referred to as a memory array 26.

The clock input circuit 20 receives the true clock signal (Clk_t) and the complementary clock signal (Clk_c) and generates an internal clock signal CLK. The internal clock signal CLK is supplied to an internal clock generator 28, such as a delay locked loop (DLL) circuit. The internal clock generator 28 generates a phase controlled internal clock signal LCLK based on the received internal clock signal CLK. The phase controlled internal clock signal LCLK is supplied to the I/O interface 18, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 30. The command decoder 30 may receive command signals from a command bus 32 and may decode the command signals to provide various internal commands. For instance, the command decoder 30 may provide command signals to the internal clock generator 28 over a bus 34 to coordinate generation of the phase controlled internal clock signal LCLK. The phase controlled internal clock signal LCLK may be used to clock data through the I/O interface 18, for instance.

Further, the command decoder 30 may decode commands, such as read commands, write commands, mode-register set commands, activate commands, or the like, and provide access to a particular memory bank 12 corresponding to the command, via bus 36. As will be appreciated, the memory device 10 may include various other decoders, such as row decoders and column decoders, to facilitate access to the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface 14 may include a command address input circuit 22 that receives and transmits the commands to provide access to the memory banks 12, such as through the command decoder 30. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 38 through the I/O interface 18. More specifically, the data may be sent to or retrieved from the memory banks 12 over data bus 42, which may include one or more bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To transmit data using higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). The DQS signals may transition and/or alternate in value between a logic low (e.g., "0") threshold amount (e.g., current value, voltage value) and a logic high (e.g., "1") threshold amount, such that data output (DQ) signals are read, written, and/or generally transmitted on a rising edge and/or falling edge of the DQS signals. The logic low threshold amount may be approximately equal to a system low voltage provided on a low voltage bus, such as a ground bus, while the logic high threshold amount may be approximately equal to a system high voltage provided on a high voltage bus (e.g., VCC). Approximately equal in value may correspond to a voltages that differ in value by a threshold amount, such as 1 volt [V], 2V, 3V, and so on, or at any larger or smaller granularity, such as 1 millivolts [mV], 0.5 mV, and so on.

DDR5 supports an internal write leveling mode. This mode allows for synchronizing the DQS with a version of the write command launched N number of clock cycles earlier than the write latency, which allows for less delay needed in the DQS clocking path to align it with the normal Cas Write Latency (CWL) generated write command timing domain. This saves power and die area by reducing delay in the DQS clocking trees and at all of the DQ data collection sites.

As will be discussed in detail below, to support this internal write leveling mode, write interamble compensation circuitry 101 (e.g., a write interamble counter and filter circuitry) may gate the incoming DQS clocks and disable the internal DQS clocks before a write burst begins and after it is over. This counting may be dynamic, as multiple write command variables may be present. For example, the count may change based upon the user of a write preamble of 2 (Preamble 2 mode) vs. a write preamble of 4 (Preamble 4 mode, which uses an extra pulse for obtaining preamble information), whether a CRC mode is active, and whether the write command is a burst length of 8 vs. 16, which may allow for interleaving gapless write bursts of either burst length 16 or burst length of 8, as determined by a command/address pin state when the write is given.

As described in detail herein, the write interamble counter and filter circuitry acts as a filter to block spurious data strobe signals that could be generated in the unknown DQS/DQSF region prior to the write preamble and after the write postamble. By performing this filtering function, the interamble counter keeps downstream components (e.g., a write four-phase DS (data sample) clocking generator) in sync by not allowing glitches that could corrupt the four-phase clocking generator to get through. The counter effectively justifies the DQS clocking so that all downstream clocks after the filter are known to be legitimate clocks and not glitches caused by the external DQS/DQSF pins being in unknown states.

A main task of the write interamble counter is generating the timed DQS filter enable/disable signals to allow the DS signals to propagate to the downstream components (e.g., the four-phase DS clocking generator). The write interamble counter also generates the timing signals for creating a decision feedback equalizer (DFE) reset for the data input buffers.

For read commands, the DQS signals are effectively additional DQ signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQ_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS c; LDQS_t and LDQS_c) corresponding to upper and lower bytes of data sent to and from the memory device 10, for instance.

An impedance (ZQ) calibration signal may also be provided to the memory device 10 through the I/O interface 18. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the I/O interface 18. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the I/O interface 18.

As may be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), or the like, may also be incorporated into the memory system 10. Accordingly, it should be understood that the block diagram of FIG. 1 is only provided to highlight certain functional features of the memory device 10 to aid in the subsequent detailed description.

In some embodiments, the memory device 10 may be disposed in (e.g., physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), Multimedia Media Cards (MMC's), Secure Digital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices enable a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. As will be appreciated, the host may include many other components, depending on the application of the host.

The host may operate to transfer data to the memory device 10 for storage and may read data from the memory device 10 to perform various operations at the host. Accordingly, to facilitate these data transmissions, in some embodiments, the I/O interface 18 may include a data transceiver 44 that operates to receive and transmit DQ signals to and from the I/O interface 18.

Figure 2:
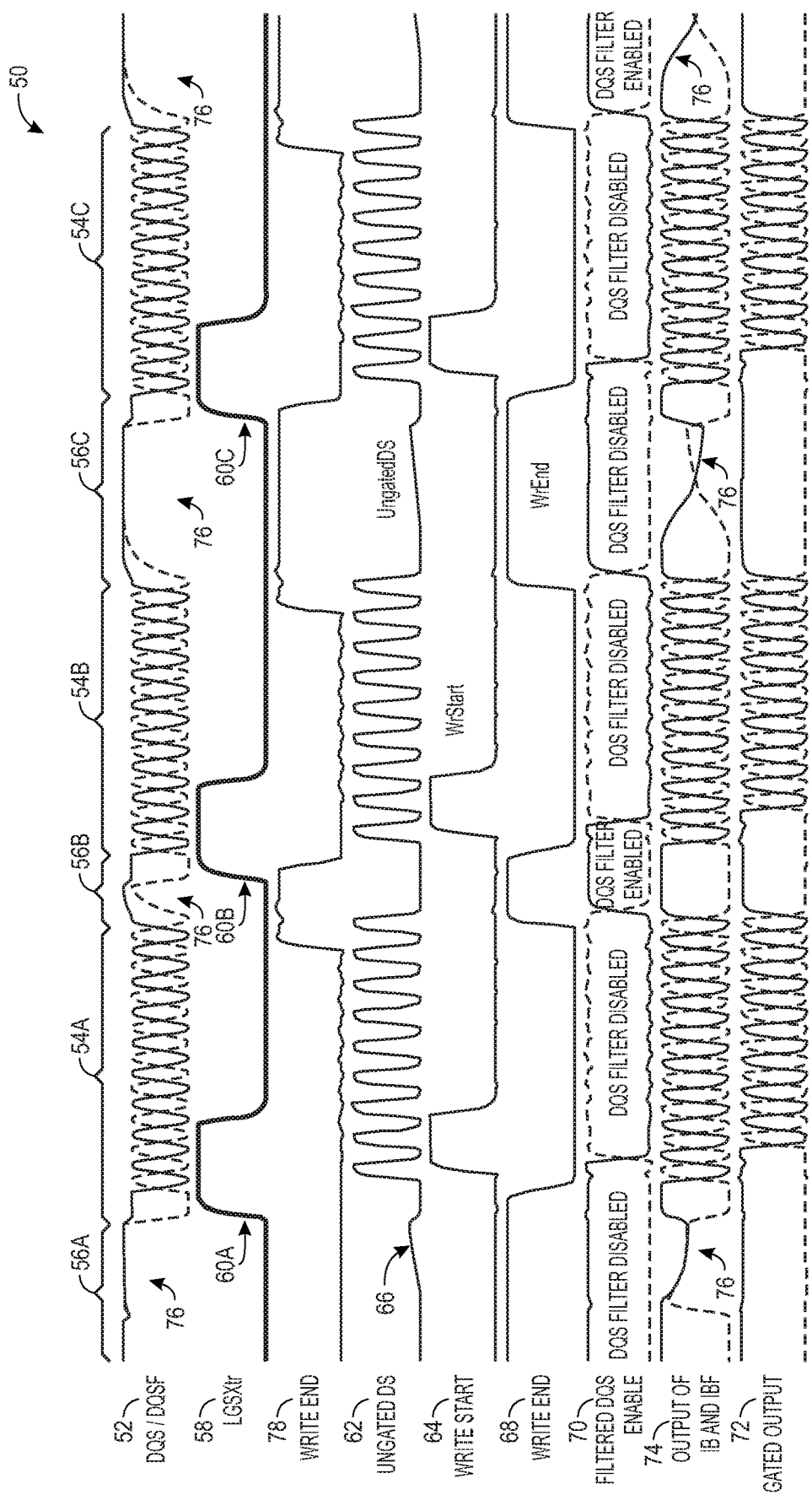
FIG. 2 is a timing diagram, illustrating effects of interamble compensation circuitry, according to an embodiment of the present disclosure.

FIG. 2 is a timing diagram 50, illustrating effects of interamble compensation circuitry, according to an embodiment of the present disclosure. As will be illustrated, in the current embodiments, when the input data strobe (e.g. the DQS signal) is not in use, a digital filter is used to turn off output of a differential input buffer, such that indeterminant interamble states are not provided with the DQS strobes.

A differential input buffer with DQS/DQSF input generates an unfiltered DQS and DQSF combination signal 52. The unfiltered DQS and DQSF combination signal 52 illustrates DQS strobes 54A, 54B, and 54C, each of which correspond to a separate write operation to be performed. As illustrated, in between the strobes 54A, 54B, and 54C, there are interamble states 56A, 56B, and 56C, which are periods of time when a write operation is not performed and, therefore, the DQS and DQSF signals are in an indeterminate state. As illustrated, during these interamble states 56A, 56B, and 56C, the DQS and DQSF may be driven at a same/converging voltage value. Traditionally, these signals will reach a differential input buffer, which will drive one of the signals high and the other low. However, which signal gets driven high and which signal gets driven low may vary from system to system and therefore there is an undesirable variable from system to system that may cause corruption in downstream components. For example, one system may bias the DQS signal to a high state, while another may bias the DQS signal to a low state, causing unpredictable data latching times.

A specification used by the memory device may define a timing when a CPU should drive one of the signals high and one of the signals low with reference to an external clock of the system. The local trained write start (LTWStr) signal 58 may be synchronized with this timing, indicating when a write command will occur. For example the LTWStr signal 58 includes a transition 60A to high, indicating the start of a first write command, a transition 60B to high, indicating the start of a second write command, and a transition 60C to high, indicating the start of a third write command.

The LTWStr signal 58 is a result of DRAM/CPU alignment training. This alignment training is used to drive the LTWStr signal 58 to arrive at high when the DQS/DQSF states are in a determinant state (e.g., one of DQS/DQSF explicitly driven to high and the other driven to low). In the current embodiment, the DQSF signal is high and the DQS signal is low.

The ungated DS signal 62 illustrates the output of the differential input buffer without filtering. To perform the filtering, when the LTWStr signal 58 is high and there is an ungated DS signal 62 transition, a latch occurs, resulting in the Write Start signal 64. The Write Start signal 64 is, therefore, justified by the ungated DS signal 62 and the LTWStr signal 58.

As may be appreciated, proper DRAM/CPU alignment may ensure that the LTWStr signal 58 transitions at the proper time. If the LTWStr signal 58 were to occur earlier, during one of the interamble states 56A, 56B, or 56C, unpredictable results could occur. For example, as illustrated at portion 66 of the ungated DS signal 62, the DS begins to rise. In some systems, without the filtering techniques described herein, this could be observed as a latching trigger, causing pre-mature latching, prior to an intended latching time for the actual write command.

When the LTWStr signal 58 transitions to high, the WEnd signal 68 is transitioned to low. The WEnd signal 68 is justified by a certain transition in the ungated DS signal 62, which may be indicated by a counter, as described in more detail below. The WEnd signal 68, when transitioning to high, indicates when the digital filter should be enabled, such that the DQS/DQSF signals should not be provided to the downstream logic.

Thus, the rising edge of the WrStart signal 64 is used to indicate when to turn the DQS filter off. When the DQS filter is off, the DQS/DQSF signal 52 is provided downstream, thus enabling the write operation. The WEnd signal 68 is used to indicate when to turn the DQS filter on. When the DQS filter is on, provision of the DQS/DQSF signal 52 to downstream components is disabled, ensuring that a write operation is not enabled.

The Filtered DQS enable signal 70 illustrates periods where the DQS filter is enabled, such that the DQS/DQSF signal 52 is not provided downstream. For example, at the periods labelled "DQS Filter Enabled" the Gated Output signal 72 maintains a determinate state, ensuring that an indeterminate state does not trigger a write or other undesirable effect. In contrast, the unfiltered output 74 of the Input Buffer and the DQS/DQSF signals 52 include indeterminate states 76, where it is unclear which of the complementary signals is in a high state/low state.

Thus, as may be appreciated, the Gated Output signal 72 provides a significant improvement over the DQS/DSQF signal 52 and unfiltered output 74, as these signals filter out data during the indeterminate phases/interamble phases 56A, 56B, and 56C. Indeed, using the current techniques, there is increased confidence that writes will be triggered in a timely manner at the DQS strobes 54A, 54B, and 54C. These techniques work for both closely timed and relatively further timed writes. For example, in the depicted embodiment three writes are associated with the three DQS strobes 54A, 54B, and 54C. The first write (triggered by DQS strobe 54A) has a closely following write (triggered by DQS strobe 54B). A relatively more distant third write (triggered by DQS strobe 54C) follows as the third write. In each case, data during the interamble phases/indeterminate phases 56A, 56B, and 56C is filtered out between the DQS strobes 54A, 54B, and 54C.

As illustrated by the Write End signal 78, the write operations may end at different times, as a number of variables may indicate the duration of a write operation (e.g., when the write operation will end). For example, write command start and end times may be based upon a spacing between writes, burst lengths, whether CRC is enabled or not, and/or whether a write preamble setting is active. Factoring in these variables for determining when the filtering should occur will be discussed in more detail below, specifically with respect to FIG. 4.

FIG. 3 is a schematic diagram of a system 100 having interamble compensation circuitry 101 of FIG. 2, according to an embodiment of the present disclosure. As illustrated, the system 100 may include a DQS input buffer 102 and DS generator 108. The DQS input buffer 102 provides the DQS/DQSF signal 52, which may be driven downstream to identify data latching periods for write commands. The DS generator 108 may make use of the DQS/DQSF signal 52 to determine write operation latching times.

The DS generator 108 may use complementary data strobe signals (DQS/DQSF) to create a four-phase version of those data strobes that wrap after every two external DQS cycles. DS0 may be a first DS generated off of the first rising edge of DQS and every other odd rising edge thereafter. DS180 may be a second DS generated off the first falling edge of DQS and every other odd falling edge thereafter. DS360 may be a third DS generated off of the second rising edge of DQS and every other even rising edge thereafter. DS540 may be a fourth DS generated off the second falling edge of DQS and every other even falling edge thereafter. The four-phase DS signals are used for front-end data capture in the DQS domain at write data parallelizer/write deserializer circuitry of the DS generator 108. That data is then put into a first-in-first-out (FIFO) buffer and sent out in the write command clock timing domain.

As mentioned above, indeterminate phases of the DQS/DQSF signal 52 may result in latching errors by the downstream components (e.g., the DS generator 108). Interamble compensation circuitry 101 is disposed between the DQS input buffer 102 and the DS generator 108 and is used to filter outputs of the DQS input buffer 102, such that data latches performed at the DS generator 108 occur only at periods of time where DQS signals provided by the Differential DQS input buffer 102 are determinate. This may help reduce glitches caused by latching triggered by indeterminate states in a DQS signal, as these indeterminate states are filtered out of the DQS signal provided to the DS generator 108.

The DQS filter 104 receives an input of the DQS input buffer 102. The input is provided to logic gates of the DQS input buffer to latch. During a preamble portion of the DQS signal (e.g., when driven low and not toggling), a local trained write start signal/start command may be latched with the ungated DS signals (e.g., ungated DS signal 62), resulting in a justified Write Start signal (e.g., write start signal 64) transition, resulting in the filtered DQS enable signal 70. The write start signal 64 may be generated by a system level block. When the central processing unit (CPU) submits a write command, a known write latency is applied, via a training algorithm, such that the write start signal 64 is in synchronization with downstream DQS signal 52 strobes.

The filtered DQS enable signal 70 provides an indication of when to filter the DQS signal 52, enabling the filtered DQS signal (e.g., gated output 72) to pass to downstream components (e.g., the DS generated 108), which may implement operation based upon the filtered DQS signal.

A write end signal 68, when present may cause the latching to flip, such that the filter is enabled, disabling the DQS signal passage to the downstream logic. In some embodiments, a write start signal 64 will trump a write end signal 68, by masking the write end signal. Thus, when both commands are present, the filter may be disabled (e.g., due to the masking of the write end signal by the local trained write start signal). The DQS filter 104 sends the filtered signal (e.g., the gated output 72) to the downstream components (e.g., the DS generator 108), which may implement write operations based upon the filtered signal.

As mentioned above, write commands may end at different times, based upon a variety of factors. The write end signal 68 may be generated based upon a count, performed by the write interamble DQS counter 106, between the write start signal 64 transitioning to high and a write completion count value (e.g., a determined number of clock cycles based upon write command variables). The write interamble DQS counter 106 may count pulses of the post-filter gated DS signal to identify when a write is completed. Specifically, the write end signal 68 is asserted after a number of pulses equal to the write completion count value are observed after the write start signal 64 is asserted. Upon reaching the specified count, the write end signal 68 may be generated, causing the DQS filter to enable, resulting in disabled provision of the DQS signal to downstream components.

FIG. 4 is a schematic diagram of an embodiment of the interamble counter circuitry 106 of FIG. 3, according to an embodiment of the present disclosure. The interamble counter circuitry 106 receives, as input, the write start signal 64 and other input signals 148. The input signals 148 specify write command variables that alter the write completion count value that indicates when a write end signal 68 should be asserted. For example, the inputs signals may include one or more indications of a gap length between write commands, a burst length associated with a write command, a preamble mode associated with the write command, and/or a CRC mode associated with the write command. These input signals may be used by the burst length factorization control circuitry 150, the write preamble factorization circuitry 152, and or the CRC factorization circuitry 154 to alter the resultant write completion value, as will be discussed in more detail below.

Beginning with a discussion of gap factorization between write commands, a write command shifter may add latency to a write command. Accordingly, in some embodiments, the system may be aware of a gap length between write commands (e.g., an indication of a number of clocks until the next write command will be received). This gap length may be used in determining the write completion count. For example, if a write has started and another write occurs before counting is completed, the interamble counter circuitry 106 may delay completion of the writes by asserting a consecutive write restart signal, which maintains the write start signal 64 in an active state until all subsequent writes are completed or there is a large enough gap between write commands to warrant a full write postamble followed by a full write preamble. In such a case, the write is considered completed and the subsequent write will initiate through a new assertion of the Write Start signal 64, as described herein.

In some embodiments, the gap length may be provided by a subset of the input signals 148 that specify a number of gaps between writes. Because write commands are posted in time, a write shifter may provide an indication of when write commands will occur, by asserting one or more of the subset of the input signals 148. For example, a Gapless input, when asserted may indicate that there is no gap between writes (e.g., indicating that there may be 8 clock cycles between write start signals of the writes). In this case, the write signal 64 may be held in an active state until both write commands complete.

In contrast, 1 gap, 2 gap, 3 gap, and/or 4 gap input signals, when asserted, may indicate that there is 1 gap, 2 gaps, 3 gaps, or 4 gaps, respectively, between the write commands. When one or more of these signals are asserted, the second write command may be treated as an independent write command that is initiated through a new assertion of the Write Start signal 64, as described herein.

Turning to a gap length counting example, when the write shifter asserts the gapless signal, this indicates that two write commands will occur without a gap between them. In DDR5, the native burst length of a command is 16 clocks. Further, because there is double data rate output, each 16 bit command utilizes 8 clock cycles (16 clocks/2). With two gapless burst length 16 data writes and double data rate output, the interamble counter circuitry 106 will count 8 clocks for the first write and 8 clocks for the second write, or 16 clocks total, indicating a length of the writes and thus, a length of the DQS enable signal 70 (that indicates when to allow the gated output 72 to reach downstream components).

When the 1 gap signal is asserted, this indicates that there is a gap between write commands. In such a case, there may be 8 clocks of writes, a no op (e.g., deselect) and then another 8 clocks. In such as case, the interamble counter circuitry 106 may count out the clocks, factoring in the gap between the end of the first write command and the start of the second write command.

As may be appreciated, the burst length is factored into the count by the interamble counter circuitry 106. In some embodiments, multiple burst lengths may be supported. For example, in DDR5, burst lengths of 8 and 16 are supported. Accordingly, the interamble counter circuit 106 may include burst length factorization control circuitry 150 that may receive in an input indicative of the write command burst length and adjust the count based upon the burst length. To do this, in some embodiments, a multiplexor may select a burst length 8 or a burst length 16 count based upon the input indicating a burst length of 8 or a burst length of 16, respectively. In a burst length 8, with double data rate output, 4 fewer clocks may be counted, as opposed to the burst length 16 case. As will be illustrated in more detail below, multiplexing may be used to adjust the clock counting.

A write preamble mode may also impact the count used by the interamble counter circuitry 106. For example, in DDR5, multiple preamble modes are supported, where a Write Preamble 2 and Write Preamble 3 mode each use a first DQS pulse for preamble. Further, a Write Preamble 4 mode uses the first two DQS pulses for preamble. As may be appreciated, this may impact when a write latching should occur. Accordingly, the write preamble factorization circuitry 152 may increase the clock count based upon the specified preamble mode when necessary. For example, in some instances, one additional clock is added to the count for Write Preamble 4 when compared with Write Preamble 2 and Write Preamble 3 modes, as an additional pulse is used for preamble with the Preamble 4 mode. As will be illustrated in more detail below, multiplexing may be used to adjust the clock counting.

A cyclic redundancy check (CRC) mode may also impact the count performed by the interamble counter circuitry 106. For example, when the CRC mode is active, a CRC code following the data may be provided. Accordingly, the clock count may be impacted by whether the CRC mode is active. The CRC factorization circuitry 154 may adjust the count for this mode. As will be illustrated in more detail below, multiplexing may be used to adjust the clock counting.

To further illustrate the counting performed by the interamble counting circuitry 106, FIGS. 5-10 are timing simulation diagrams, illustrating write operations triggered in accordance with the interamble compensation circuitry, according to an embodiment of the present disclosure.

Figure 5:
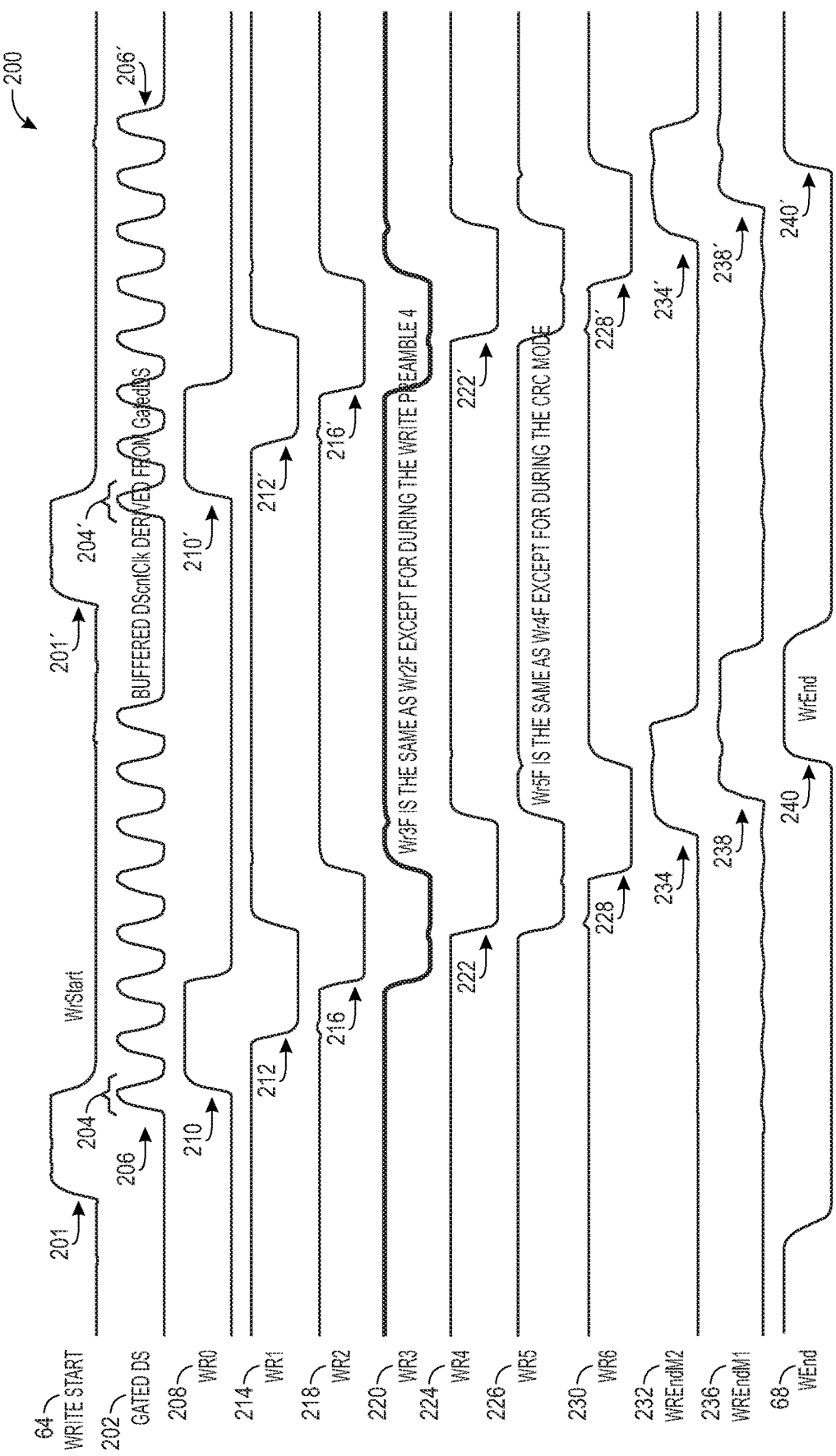
FIGS. 5-10 are timing simulation diagrams, illustrating write operations triggered in accordance with the interamble compensation circuitry, according to embodiments of the present disclosure.

FIG. 5 illustrates a non-gapless sequence 200 of two burst length 16 write commands, in accordance with an embodiment. The write commands use a Preamble 2 mode with CRC mode disabled. The gated DS signal 202 is used to derive a buffered count that accounts for write commands variables that may be present. Here, the input signals may indicate that Write Preamble 2 mode is active. Thus, the first pulse 204 and 204' for each set of pulses 206 and 206' of the gated DS signal 202, respectively, correspond to a preamble of a corresponding write command. The remaining pulses are used for data collection. As mentioned above, for burst length 16 write commands, 8 clock cycles may be counted. Further, additional clock cycles may be counted when a preamble 4 mode that uses two pulses for a preamble is active and/or a CRC mode that uses a pulse for CRC is active. To implement the count, multiple nets (e.g., nets WR0 208, WR1 214, WR2 218, WR3 220, WR4 224, WR5 226, WR6 230. WREndM2 (Write End Minus 2 clock cycles) 232, WREndM1 (Write End minus 1 clock cycle) 236 and/or the Write End signal 68) may be utilized.

As mentioned above, the countdown starts from the assertion 201 of the write start signal 64. The WR0 net 208 illustrates the first count at the next clock signal 210. The next clock cycle 212 is also counted. This is illustrated in the WR1 net 214. The next clock signal 216 is also counted, as illustrated in the WR2 net 218.

The count does not increment to the next clock cycle in the WR3 net 220, unless Write Preamble 4 mode is active. Here, we are in Write Preamble 2 mode, so the WR3 net 220 remains the same as the WR2 net 218. This may be achieved by using a multiplexor to multiplex around a counter increment in the WR3 net 220. In this manner, the count is not increased at this stage, unless the Write Preamble 4 mode, which requires an additional pulse for the preamble, is enabled.

The count also increments to count the next clock cycle 222, as indicated by WR4 net 224. When the CRC mode is enabled, the count will increment at the WR5 net 226. However, as indicated in the current example, the count does not increment, as the CRC mode is not enabled for the current write commands. This may be implemented by multiplexing around the increment, when the CRC mode is not enabled. The count may then increment to the next clock cycle 228 at the WR6 signal 230.

At the WREndM2 net 232 (Write End minus two clock cycles), the count increases to the next clock cycle 234. Further, at the WREndM1 net 236, the count increases to the next clock cycle 238. The WREndM1 net 236 signal is sent to the DQS filter circuitry 104 where it is sampled by the Gated Output 72. This results in the assertion of the write end signal 68 at the next clock cycle 240. As mentioned above, the assertion of the write end signal 68 may provide an indication as to when the DQS filter should be enabled, such that downstream components do not receive indeterminate DQS phases.

The second write command, includes the same burst length, preamble mode, and CRC mode as the first write command. Thus the counting performed by the interamble counting circuitry 106 is similar to the counting performed for the first write command.

The countdown starts from the assertion 201' of the write start signal 64 associated with the second command. The WR0 net 208 illustrates the first count for the second write command at the next clock signal 210'.

The next clock cycle 212' is also counted. This is illustrated in the WR1 net 214. The next clock signal 216' is also counted, as illustrated in the WR2 net 218.

The count does not increment to the next clock cycle in the WR3 net 220, unless Write Preamble 4 mode is active. Here, we are in Write Preamble 2 mode, so the WR3 net 220 remains the same as the WR2 net 218. This may be achieved by using a multiplexor to multiplex around an increment to the counter in the WR3 net 220. In this manner, the count is not increased at this stage, unless the Write Preamble 4 mode, which requires an additional pulse for the preamble, is enabled.

The count also increments to count the next clock cycle 222', as indicated by WR4 net 224. When the CRC mode is enabled, the count will increment at the WR5 net 226. However, as indicated in the current example, the count does not increment, as the CRC mode is not enabled for the current write commands. This may be implemented by multiplexing around the increment, when the CRC mode is not enabled. The count may then increment to the next clock cycle 228' at the WR6 signal 230.

At the WREndM2 net 232 (Write End minus two clock cycles), the count increases to the next clock cycle 234'. Further, at the WREndM1 net 236, the count increases to the next clock cycle 238'. This results in the assertion of the write end signal 68 at the next clock cycle 240'. As mentioned above, the assertion of the write end signal 68 may provide an indication as to when the DQS filter should be enabled, such that downstream components do not receive indeterminate DQS phases.

Figure 6:
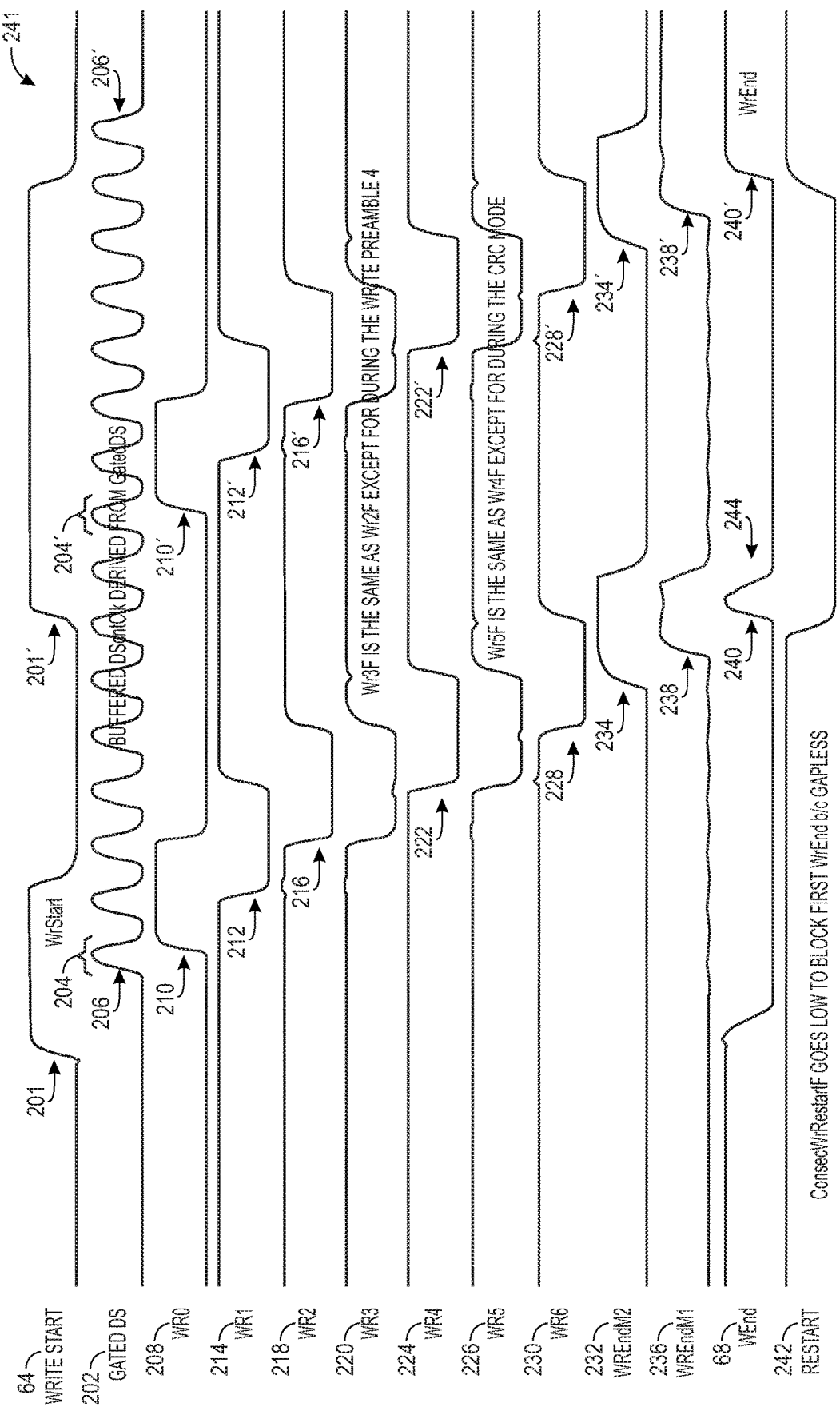

Turning now to a discussion of the effects of a gapless write, FIG. 6 illustrates a gapless sequence 241 of two burst length 16 write commands, in accordance with an embodiment. Because the burst lengths, preamble mode, and CRC mode are the same as the example provided in FIG. 5, the count increments very similarly as described in FIG. 5. However, because the write commands are provided in a gapless manner (e.g., as indicated by input signals to the interamble counter circuitry 106), the first write end between the write commands is suppressed. This may be accomplished by transitioning a restart signal 242 (e.g., ConsecWrRestartF signal transitions to low in the current embodiment), which causes the WrStart signal 64 to assert until all subsequent writes are completed or there is a large enough gap between write commands to warrant a full write postamble followed by a full write preamble (e.g., at least 1 gap between writes, as indicated by the gap input signals).

As mentioned above, assertion of the WrStart signal 64 may trump assertion of the WrEnd signal 68. Thus, the restart signal 242, by causing the WrStart signal 64 to assert, may result in suppression of a write end assertion, as illustrated at 244.

Figure 7:
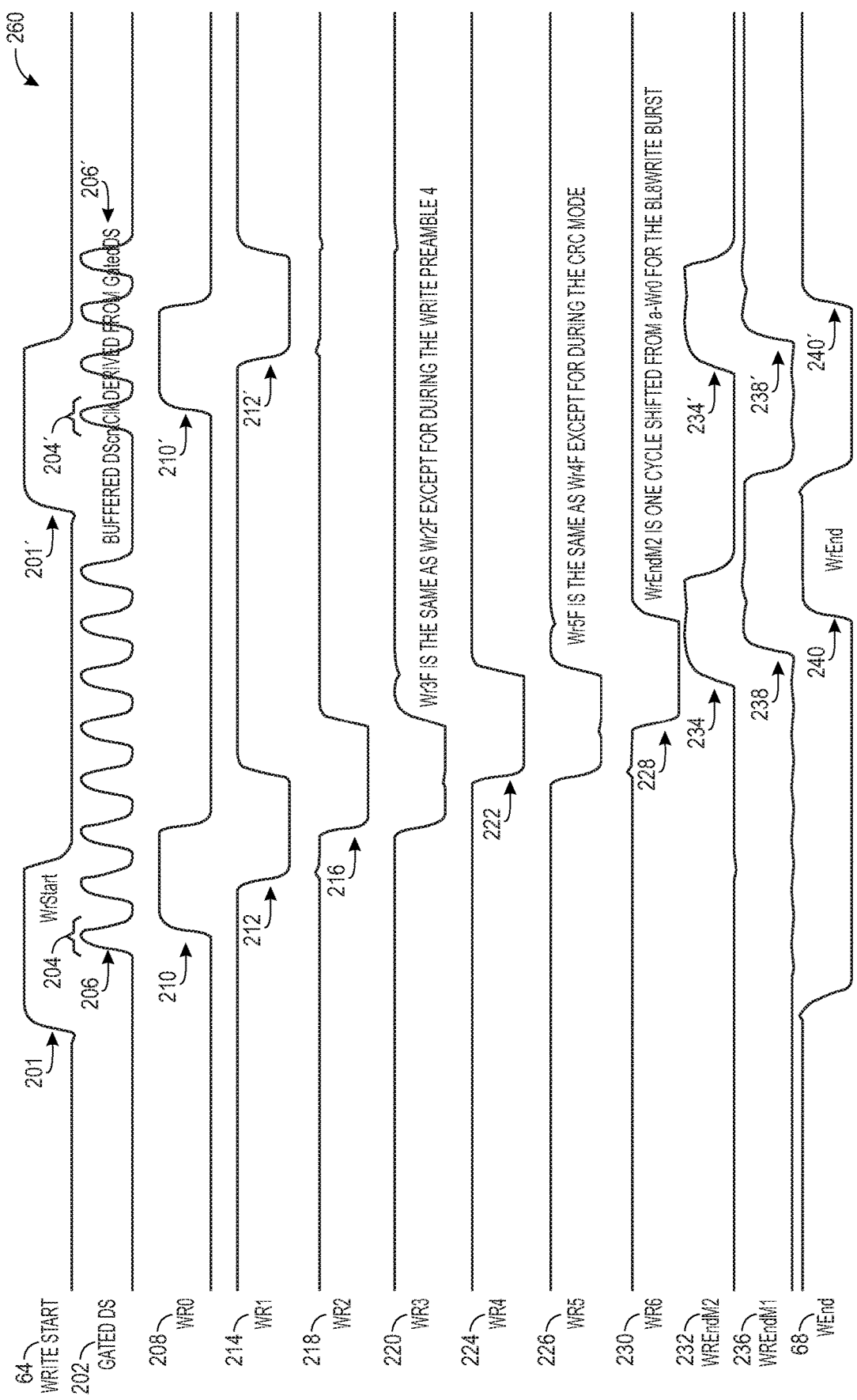

As mentioned above, burst length changes may also affect the count. FIG. 7 illustrates a non-gapless sequence 260 of one burst length 16 write command to a burst length 8 write command, in accordance with an embodiment. The write commands use a Preamble 2 mode. Because the burst length, preamble mode, and CRC mode are the same for the first write command of FIG. 7 as the example provided in FIG. 5, the count for the first write command increments very similarly as described in FIG. 5. However, because the burst length changes to burst length 8 for the second write command, the count is incremented differently for this command.

For burst length 8 write commands, only a subset of the nets are utilized, as only 4 clock cycles are counted, as opposed to the 8 clock cycles counted for a burst length of 16. Accordingly, for the second write command with the burst length of 8, the first clock signal 210' is counted, as illustrated by net WR0 208. The second clock signal 212' is counted, as illustrated by net WR1 214. As illustrated by net WREndM2 234, is shifted one clock cycle from net WR0 208. Further, at the WREndM1 net 236, the count increases to the next clock cycle 238'. This results in the assertion of the write end signal 68 at the next clock cycle 240'. Thus, four clock cycles are counted in the burst length 8 case, as opposed to 8 clock cycles counted in the burst length 16 case.

Figure 8:
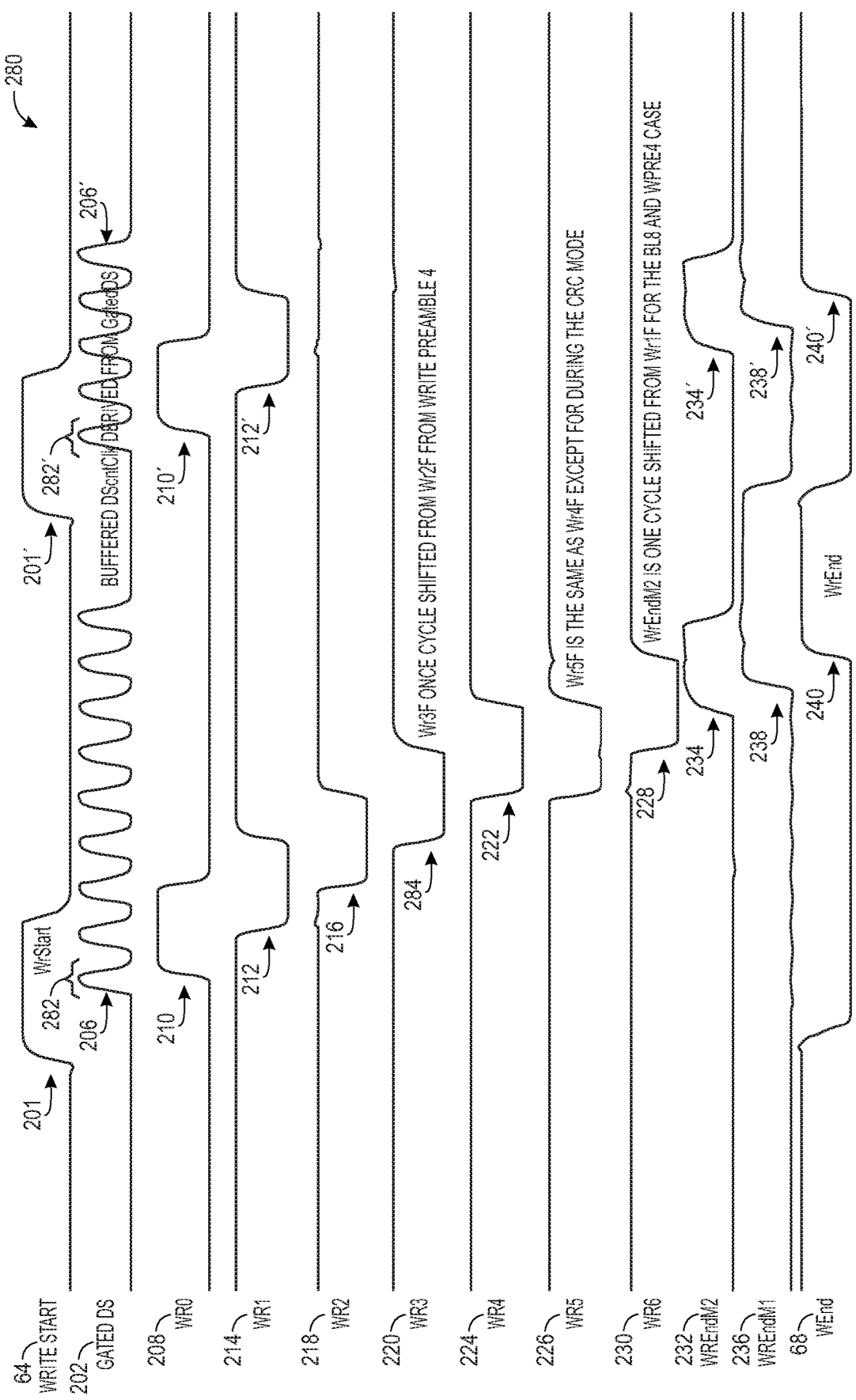

Turning now to a discussion of changing the count based upon preamble mode, FIG. 8 illustrates a non-gapless sequence 280 of one burst length 16 write command to a burst length 8 write command. The sequence 280 is the same as sequence 260 of FIG. 7, except that the write commands use a Preamble 4 mode, which adds one additional clock cycle to the count for the commands, as an additional pulse (e.g., pulses 282 and 282') are used for the preamble of the write commands. The additional clock cycle added to the count for the first write command is illustrated by the one clock cycle shift 284 at net WR3 220. Thus, the subsequent clock cycles are each shifted one additional clock cycle, when compared with the corresponding clock cycles of FIG. 7. Accordingly, the write end signal 68 assertion for the first write command is also delayed one additional clock cycle.

Regarding the second write command, the additional clock cycle is introduced into the count by shifting the WREndM2 net 232 by one cycle from the WR1 net 214. This takes into account the burst length 8 as well as the additional clock cycle for the Preamble 4 mode. Thus, the subsequent clock cycles are each shifted one additional clock cycle, when compared with the corresponding clock cycles of FIG. 7. Accordingly, the write end signal 68 assertion for the second write command is also delayed one additional clock cycle.

Figure 9:
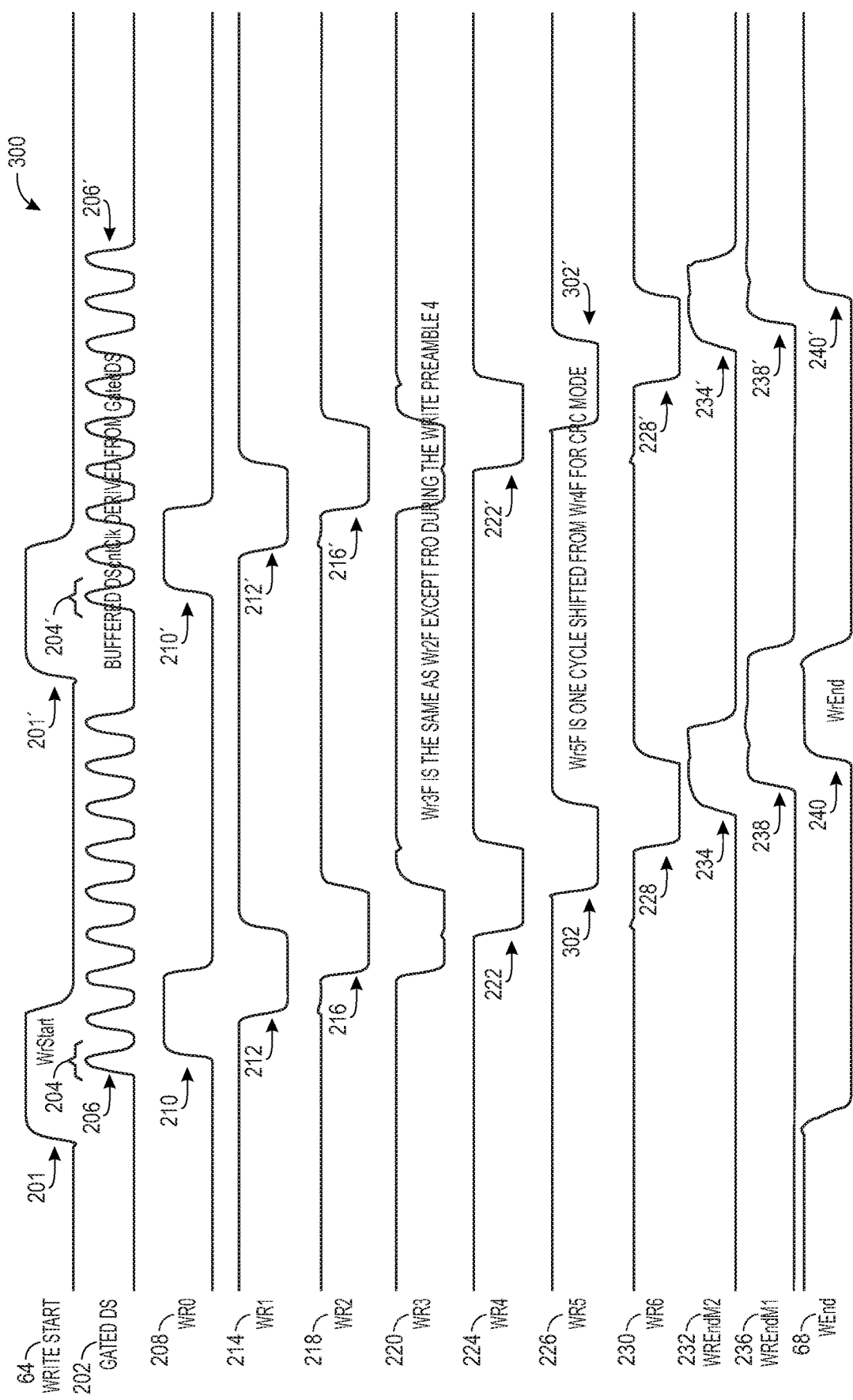

Turning now to count modifications for an active CRC mode, FIG. 9 illustrates a non-gapless sequence 300 of two burst length 16 write commands that use a Preamble 2 mode, similar to the sequence 200 provided in FIG. 5. In contrast to the sequence 200 of FIG. 5, in the current sequence 300, the CRC mode is enabled, such that a postamble includes CRC data. As mentioned above, in such a sequence, an additional clock cycle may be counted, such that write end is shifted out an additional clock cycle to account for the CRC data. Thus, the counting in the sequence 300 mirrors the counting in sequence 200 except that additional clock cycles 302 and 302' are counted at WR5 net 226 to account for the extra clock cycle count for the active CRC mode. This causes each of the subsequent counted clock signals to shift one additional clock cycle, resulting in an additional one clock cycle delay in assertion of the write end signal 68.

Figure 10:
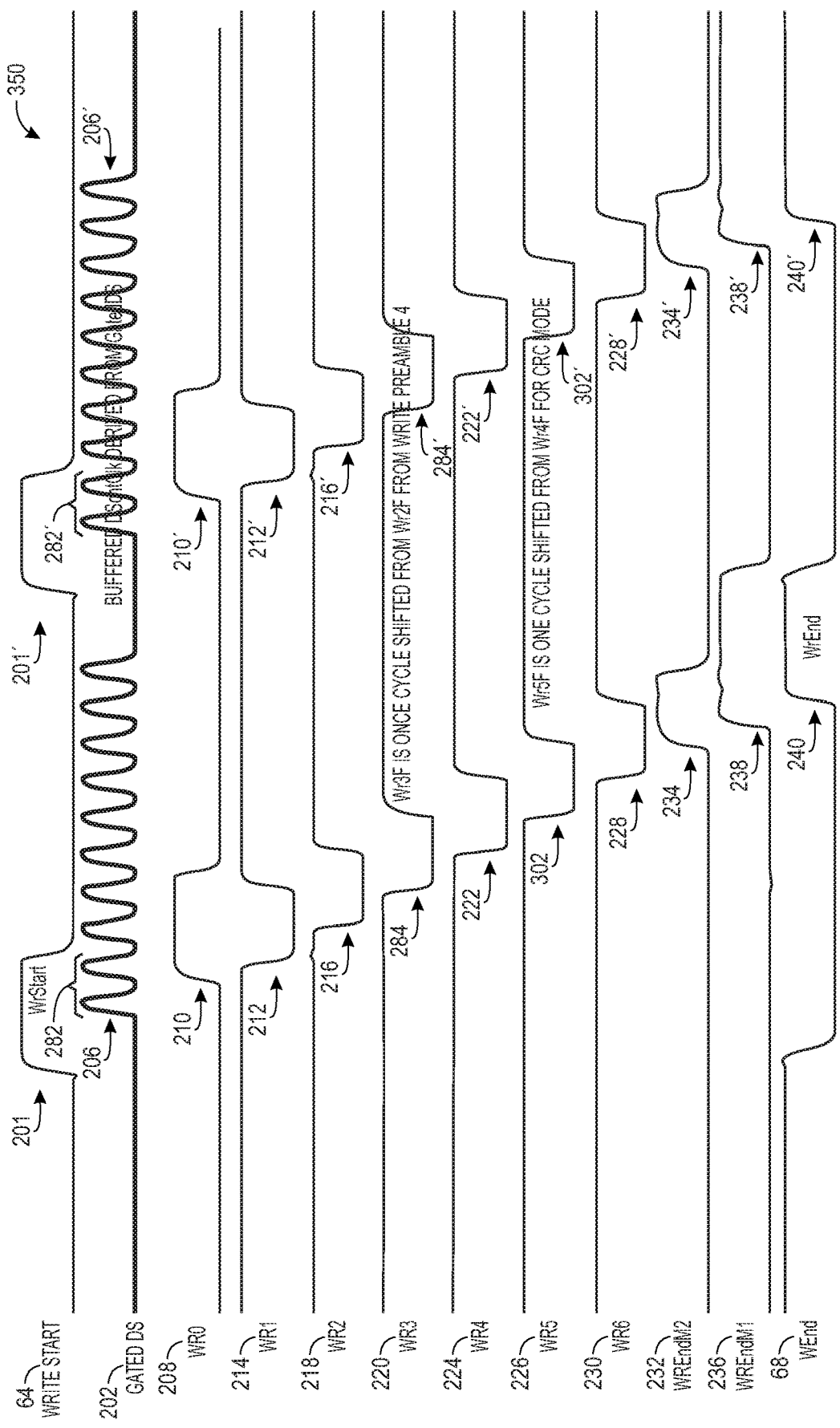

FIG. 10 illustrates a non-gapless sequence 350 of two burst length 16 write commands that use a Preamble 4 mode with CRC mode active. As may be appreciated, in this sequence 350, each of the clock cycles is counted (e.g., 8 clock cycles for burst length 16, 1 additional clock cycle for the Preamble 4 mode, and 1 additional clock cycle for the CRC mode).

The gated DS signal 202 is used to derive a buffered count that accounts for write commands variables that may be present. Here, the input signals may indicate that Write Preamble 4 mode is active. Thus, the first two pulse 282 and 282' for each set of pulses 206 and 206' of the gated DS signal 202, respectively, correspond to a preamble of a corresponding write command. The remaining pulses are used for data collection. As mentioned above, for burst length 16 write commands, 8 clock cycles may be counted. Further, additional clock cycles may be counted when a preamble 4 mode that uses two pulses for a preamble is active and/or a CRC mode that uses a pulse for CRC is active. To implement the count, multiple nets (e.g., nets WR0 208, WR1 214, WR2 218, WR3 220, WR4 224, WR5 226, WR6 230. WREndM2 232, WREndM1 236 and/or the Write End signal 68) may be utilized.

As mentioned above, the countdown starts from the assertion 201 of the write start signal 64. The WR0 net 208 illustrates the first count at the next clock signal 210. The next clock cycle 212 is also counted. This is illustrated in the WR1 net 214. The next clock signal 216 is also counted, as illustrated in the WR2 net 218.

The count increments to the next clock cycle 284 in the WR3 net 220, as Write Preamble 4 mode is active. The count also increments to count the next clock cycle 222, as indicated by WR4 net 224. Since the CRC mode is enabled, the count will increment at the WR5 net 226 to the next clock cycle 302. The count may then increment to the next clock cycle 228 at the WR6 signal 230.

At the WREndM2 net 232 (Write End minus two clock cycles), the count increases to the next clock cycle 234. Further, at the WREndM1 net 236, the count increases to the next clock cycle 238. This results in the assertion of the write end signal 68 at the next clock cycle 240. As mentioned above, the assertion of the write end signal 68 may provide an indication as to when the DQS filter should be enabled, such that downstream components do not receive indeterminate DQS phases.

The second write command, includes the same burst length, preamble mode, and CRC mode as the first write command. Thus the counting performed by the interamble counting circuitry 106 is similar to the counting performed for the first write command.

The countdown starts from the assertion 201' of the write start signal 64 associated with the second command. The WR0 net 208 illustrates the first count for the second write command at the next clock signal 210'.

The next clock cycle 212' is also counted. This is illustrated in the WR1 net 214. The next clock signal 216' is also counted, as illustrated in the WR2 net 218. The count then increments to the next clock cycle 284' in the WR3 net 220, as Write Preamble 4 mode is active.

The count also increments to count the next clock cycle 222', as indicated by WR4 net 224. Since the CRC mode is enabled, the count will increment to the next clock 302' at the WR5 net 226. The count may then increment to the next clock cycle 228' at the WR6 signal 230.

At the WREndM2 net 232 (Write End minus two clock cycles), the count increases to the next clock cycle 234'. Further, at the WREndM1 net 236, the count increases to the next clock cycle 238'. This results in the assertion of the write end signal 68 at the next clock cycle 240'. As mentioned above, the assertion of the write end signal 68 may provide an indication as to when the DQS filter should be enabled, such that downstream components do not receive indeterminate DQS phases.

Technical effects of the present disclosure include systems and methods that permit filtering of indeterminate interamble states from one or more clocking signal (e.g., DQS, DQSF signals) to reduce unintended latching or other effects caused by these interambles. To filter out these interambles, a compensation circuit may determine a local write start time via timing training of the system. Upon the local write start time, a filter will disable, allowing the DQS signal to propagate to downstream components. A write end counter will determine a number of clock cycles where the DQS should be provided, based upon the variables described herein. A countdown of the number of clock cycles indicates when the DQS signal should no longer be propagated to the downstream components. Thus, when the countdown of clock cycles is complete, the filter is reactivated, suppressing provision of the DQS signal to the downstream components. This results in suppression of presentation of indeterminate periods of the DQS signal, resulting in more predictable operations of the downstream components (e.g., fewer improperly timed data latches).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a differential input buffer configured to provide input/output data strobe (DQS) signals used to latch write command data of one or more write commands by the device, the DQS signals comprising at least one indeterminate interamble state; and
interamble compensation circuitry, configured to:
identify a write start time and a write end time; and
activate a timed filter based upon the write start time and the write end time, wherein the timed filter causes a refrain of provision of a subset of the DQS signals to a downstream component of the device, wherein the subset of the DQS signals comprise signals prior to a preamble of one or more of the write commands, signals after a postamble of the one or more write commands, or both.

2. The device of claim 1, wherein the subset of the DQS signals comprises signals prior to the preamble of one or more of the write commands and signals after a postamble of the one or more write commands.

3. The device of claim 1, comprising the downstream component, wherein the downstream component comprises a data sample (DS) generator that makes use of at least a portion of the DQS signals to determine write operation latching times.

4. The device of claim 3, wherein the DS generator comprises a four-phase DS generator that generates a four-phase version of the DQS signals.

5. The device of claim 1, wherein the interamble compensation circuitry comprises a write interamble DQS counter circuitry configured to:
count a number of clock cycles after the write start time to identify the write end time; and
cause assertion of a write end signal based upon the number of clock cycles after the write start time.

6. The device of claim 5, wherein the write interamble DQS counter circuitry is configured to:
identify when a preamble mode that utilizes an additional clock cycle for provision of the preamble is active; and
count an additional clock cycle when the preamble mode is active.

7. The device of claim 5, wherein the write interamble DQS counter circuitry is configured to:
identify when a cyclic redundancy check (CRC) mode is active; and
count an additional clock cycle when the CRC mode is active.

8. The device of claim 5, wherein the write interamble DQS counter circuitry is configured to:
identify a burst length associated with the write commands; and
determine the number of clock cycles based at least in part upon the burst length.

9. The device of claim 8, wherein the write interamble DQS counter circuitry is configured to set the number of clock cycles to 8 clock cycles for a burst length of 16.

10. The device of claim 8, wherein the write interamble DQS counter circuitry is configured to set the number of clock cycles to 4 clock cycles for a burst length of 8.

11. The device of claim 5, wherein the write interamble DQS counter circuitry is configured to count the number of clock cycles by multiplexing received signals based upon parameters associated with the write commands.

12. The device of claim 1, wherein the interamble compensation circuitry causes generation of a gated output without the at least one indeterminate interamble state that is derived from the DQS signals, the gated output comprising data strobes.

13. The device of claim 1, wherein the interamble compensation circuitry is configured to support gapless write commands, by:
identifying a zero gap between a first write command and a second write command; and
in response to identifying the zero gap, transition a restart signal, the transition causing suppression of a write end signal for the first write command.

14. A circuitry-implemented method, comprising:
identifying a write start time and a write end time of a write command;
activating a timed filter based upon the write start time and the write end time; and
causing, in a gated output, at least one indeterminate interamble state to be filtered out of an input/output data strobe (DQS) signal of a differential input buffer; and
causing transmission of the gated output to a data sample (DS) generator that makes use of at least a portion of the DQS signal to determine write operation latching times, such that the indeterminate interamble states do not impact the determined write operation latching times.

15. The circuitry-implemented method of claim 14, comprising:
identifying the write end time, by:
determining a number of clock cycles associated with the write command; and
counting the number of clock cycles after the write start time to identify the write end time.

16. The circuitry-implemented method of claim 15, comprising:
supporting multiple preamble modes, by:
identifying when a preamble mode that utilizes an additional clock cycle for provision of the preamble is active;
counting an additional clock cycle when the preamble mode is active; and
otherwise, when a different preamble mode is active, refrain from counting the additional clock cycle;

supporting a cyclic redundancy check mode, by:
  identifying when a cyclic redundancy check (CRC) mode is active; and
  counting an additional clock cycle when the CRC mode is active; and
supporting multiple burst lengths, by:
  identifying a burst length associated with the write commands; and
  determining the number of clock cycles based at least in part upon the burst length.

17. The circuitry-implemented method of claim 16, comprising:
  identifying the burst length as either 8 or 16;
  when the burst length is 8, determining the number of clock cycles as 4; and
  when the burst length is 16, determining the number of clock cycles as 16.

18. Interamble compensation circuitry, comprising:
  filtering circuitry configured to, when active, filter out portions of an input/output data strobe (DQS) signal of a differential input buffer, wherein the filtered out portions are not supplied to a downstream component that makes use of the DQS signal to identify write operation latching times; and
  counting circuitry, configured to:
    identify a write start time of a write command;
    determine a number of clock cycles associated with the write command;
    count the number of clock cycles after the write start time to identify an end time of the write command; and
    activate the filtering circuitry based upon the start time and the end time of the write command, causing, in a gated output, at least one indeterminate interamble state to be filtered out of the DQS signal, for provision to the downstream component.

19. The interamble compensation circuitry of claim 18, wherein the counting circuitry is configured to support gapless write commands by suppressing assertion of a write signal at an end of a first write command, when a second write command is initiated prior to completion of the first write command.

20. The interamble compensation circuitry of claim 18, wherein the counting circuitry is configured to:
  support multiple preamble modes, by:
    identifying when a preamble mode that utilizes an additional clock cycle for provision of the preamble is active;
    counting an additional clock cycle when the preamble mode is active; and
    otherwise, when a different preamble mode is active, refrain from counting the additional clock cycle;
  support a cyclic redundancy check mode, by:
    identifying when a cyclic redundancy check (CRC) mode is active; and
    count an additional clock cycle when the CRC mode is active; and support multiple burst lengths, by:
    identifying a burst length associated with the write commands; and
    determining the number of clock cycles based at least in part upon the burst length.

* * * * *